(12) United States Patent
Chen et al.

(10) Patent No.: US 9,748,130 B2
(45) Date of Patent: Aug. 29, 2017

(54) WAFER TAPING SCHEME

(71) Applicant: Taiwan Semiconductor Manufacturing Company, Ltd., Hsin-Chu (TW)

(72) Inventors: Wen-Ming Chen, Zhunan Township (TW); Wei-Chih Chen, Jhudong Township (TW); Tung-Hsiao Yu, Zhubei (TW); Min-Yu Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 295 days.

(21) Appl. No.: 14/093,221

(22) Filed: Nov. 29, 2013

(65) Prior Publication Data

US 2015/0155195 A1 Jun. 4, 2015

(51) Int. Cl.
*H01L 21/00* (2006.01)
*H01L 21/683* (2006.01)
*H01L 21/67* (2006.01)

(52) U.S. Cl.
CPC .... *H01L 21/6836* (2013.01); *H01L 21/67132* (2013.01); *H01L 2221/6834* (2013.01); *H01L 2221/68327* (2013.01); *Y10T 156/10* (2015.01)

(58) Field of Classification Search
CPC ............. Y10T 156/10; H01L 21/67132; H01L 21/6836; H01L 2221/68327; H01L 2221/6834; B65H 22/022; B65H 23/044; B65H 23/063; B65H 23/085; B65H 23/105; B65H 23/14; B65H 23/1825; B65H 23/1888; B65H 23/1955
USPC .................................................. 156/64, 351
See application file for complete search history.

(56) References Cited

U.S. PATENT DOCUMENTS

| | | | |
|---|---|---|---|
| 6,080,263 A * | 6/2000 | Saito ................. | H01L 21/67092 156/253 |
| 2007/0193672 A1* | 8/2007 | Yamamoto ............. | B29C 63/02 156/64 |
| 2010/0059183 A1* | 3/2010 | Lin .................... | H01L 21/67132 156/351 |

* cited by examiner

*Primary Examiner* — George Koch
(74) *Attorney, Agent, or Firm* — Slater Matsil, LLP

(57) ABSTRACT

A method includes setting a first tension value of a laminating tape during a standby mode. A second tension value of the laminating tape is set during taping on a wafer. The second tension value is different from the first tension value. A third tension value of the laminating tape is set after taping. The third tension value is different from the second tension value.

22 Claims, 4 Drawing Sheets

WAFER TAPING SCHEME

TECHNICAL FIELD

The present disclosure relates generally to an integrated circuit and more particularly a wafer taping scheme.

BACKGROUND

For a wafer taping process, diverse taping materials are used for different applications. A wafer taping scheme adapted for different taping materials and different processes is desirable to avoid bubble/wrinkle defects on the laminating tape and/or warping the wafer.

BRIEF DESCRIPTION OF THE DRAWINGS

Reference is now made to the following descriptions taken in conjunction with the accompanying drawings, in which.

DETAILED DESCRIPTION

Figure 1:
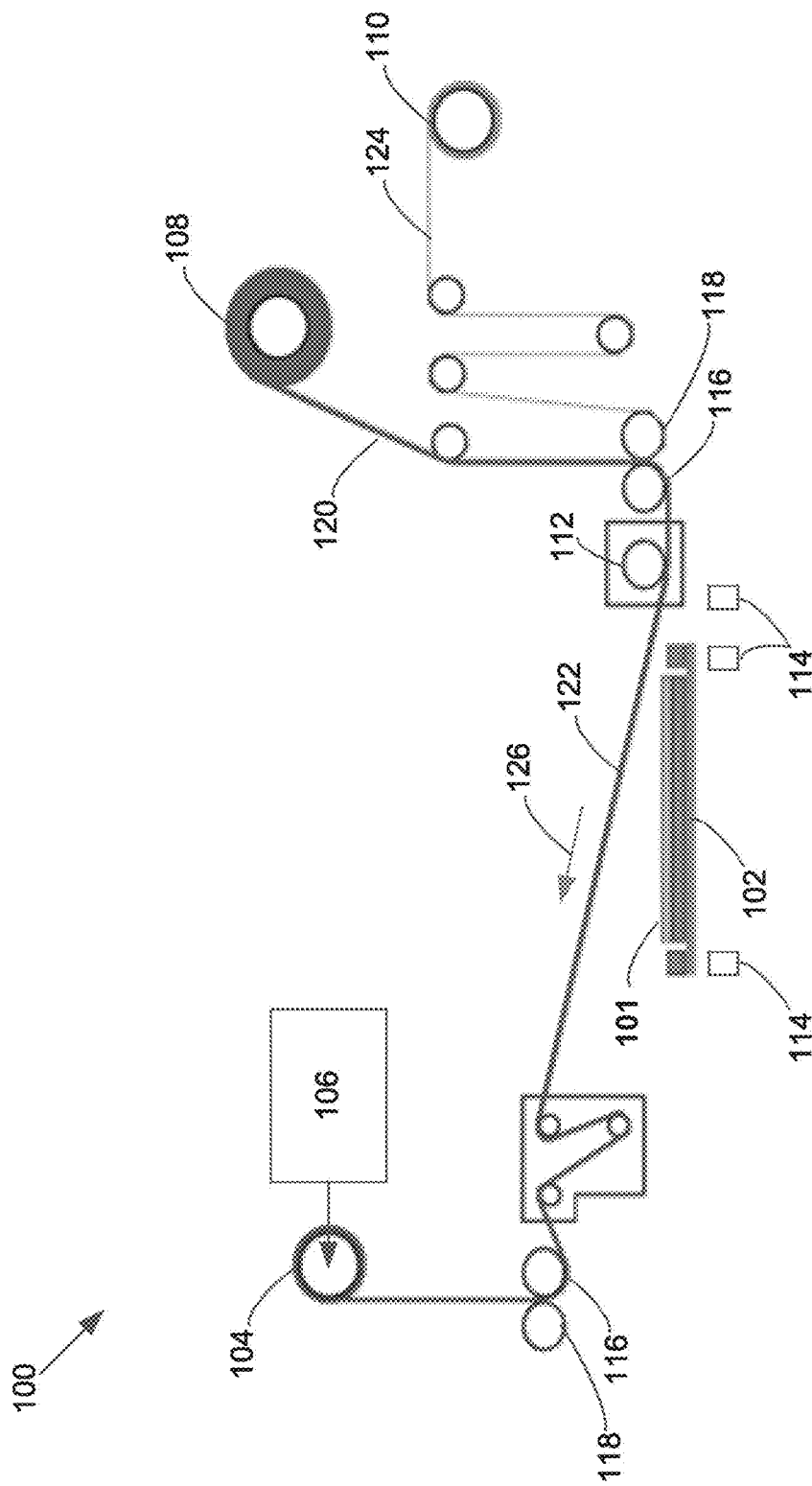
FIG. 1 is a schematic diagram of an exemplary wafer taping apparatus at a standby stage according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary wafer taping apparatus 100 at a standby stage according to some embodiments. The wafer taping apparatus 100 includes a taping table 102 that holds a wafer 101 during a taping (lamination) process. A laminator roller 112 is used to apply a laminating tape 122 to the wafer 101.

Three sensors 114 detect the position of the laminator roller 112 and are located at a standby position, a taping start position, and a taping finish position in some embodiments. The laminator roller 112 in FIG. 1 is shown at the standby position. In some embodiments, the sensors 114 can be an obstruction sensor. For example, a light detector and a laser can be located at a specific position to detect when the laminator roller 112 blocks the light. Any other suitable sensors can be used such as magnetic position sensor, etc.

A tension roller 104 is configured to set the tension of the laminating tape 122 based on the position of the laminator roller 112 detected by the sensors 114. A tension controller 106 is coupled to the tension roller 104 and controls the tension of the laminating film 122. The tension controller 106 can use any control circuit known in the art and can use variable resistors to change the applied voltage to the motor that rotates the tension roller 104 in order to change the lamination tape 122 tension in some embodiments. In other embodiments, other rollers such as supply roller 108, fixed rollers 116, nip rollers 118, or any additional roller/module can be used to control the tension of the laminating tape 122. For example, a servomotor can be used in the supply roller 108.

At the standby stage in FIG. 1, the tension controller 106 sets a first tension value of the laminating film 122 using the tension roller 104. An arrow 126 shows the direction of feeding the laminating film 122 from the supply roller 108 to the tension roller 104 (and the tension). Fixed rollers 116 and nip rollers 118 are used to help guiding the laminating tape 122 and the liner 124 (discussed below).

In some embodiments, the tension roller 104, supply roller 108, fixed rollers 116, and nip rollers 118 comprise silicon with a diameter of about 50 mm. Any other suitable material or dimension can be used in other embodiments.

Figure 4B:
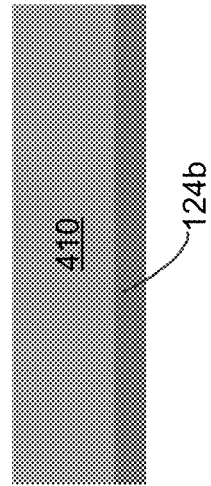
FIGS. 4A-4B are exemplary wafer tapes used in the wafer taping apparatus in FIGS. 1-3 according to some embodiments.
Figure 4A:
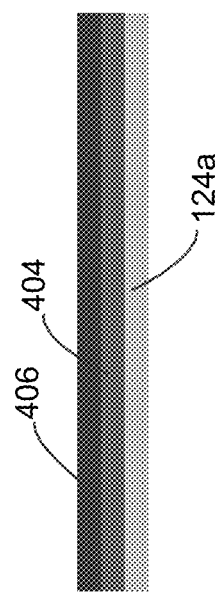

A wafer tape 120 may include both laminating tape 122 and liner 124 in some embodiments. Liner 124 prevents laminating tape 122 from sticking to itself when it is on a roll, but must be removed before applying laminating tape 122 to, e.g., a wafer 101. A recycle roller 110 is configured to collect the liner 124 after separation from the laminating tape 122. A supply roller 108 is configured to feed the laminating tape 122 (and the liner 124). The supply roller 108 has a roll of the wafer tape 120 that includes the laminating tape 122 and the liner 124. The liner 124 can comprise polyethylene (PE) in some embodiments and the laminating tape 122 can comprise different material depending on applications. For example, the laminating tape 122 can be a dry film for photolithography as shown in FIG. 4A or a back grinding film for a backside grind process as shown in FIG. 4B.

Figure 2:
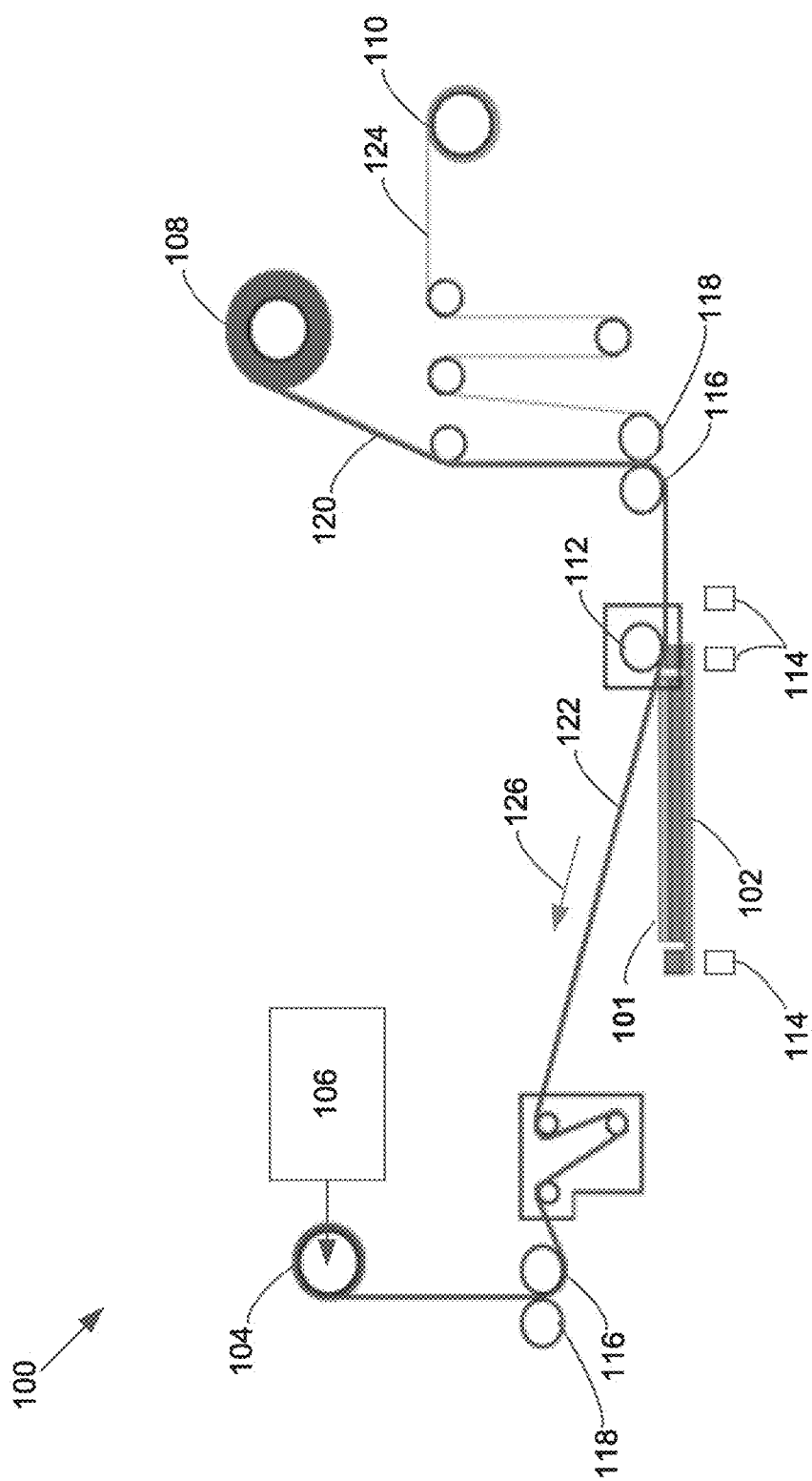
FIG. 2 is a schematic diagram of an exemplary wafer taping apparatus at a taping stage according to some embodiments.

FIG. 2 is a schematic diagram of an exemplary wafer taping apparatus 100 at a taping stage according to some embodiments. The laminator roller 112 in FIG. 2 is shown at the taping start position at one side edge of the wafer 102. At the taping start stage in FIG. 2, the tension controller 106 sets a second tension value of the laminating film 122 using the tension roller 104. An arrow 126 shows the direction of feeding the laminating film 122 from the supply roller 108 to the tension roller 104 (and the tension).

The second tension value is different from the first tension value. In some embodiments, the second tension value at the taping start stage in FIG. 2 is higher than the first tension value in the standby stage in FIG. 1, for instance when a dry film is used for the laminating film 122. The dry film is relatively easy to separate from the liner 124. Thus, the dry film only needs a relatively low tension to separate it. But the tension is increased at the taping start stage because a low tension lamination can cause wrinkle and bubble defects the wafer if the dry film shifts a little. In one example, 35%-45% tension is applied at the taping start stage in FIG. 2, compared to 15%-25% tension at the standby stage in FIG. 1. The percentage tension is referenced based on the maximum variable resistor value (e.g., 50 Kohm) used in the tension controller 106. Actual tension of the lamination tape 122 can vary depending on applications.

In other embodiments, the second tension value at the taping start stage in FIG. 2 is lower than the first tension value in the standby stage in FIG. 1, for instance when a back grinding film is used for the laminating film 122. The back grinding film is not as easy to separate from the liner 124 as the dry film because of high viscosity. Thus, high tension is used to separate the back grinding film, but the tension is lessened at the taping start stage due to potential wafer warping problem from high tension lamination. In one example, 15%-25% tension is applied at the taping start stage in FIG. 2, compared to 45%-55% tension at the standby stage in FIG. 1. The tension percentage value is referenced based on the maximum variable resistor value (e.g., 50 Kohm) used in the tension controller 106 in some embodiments. Actual tension of the lamination tape 122 can vary depending on applications.

Figure 3:
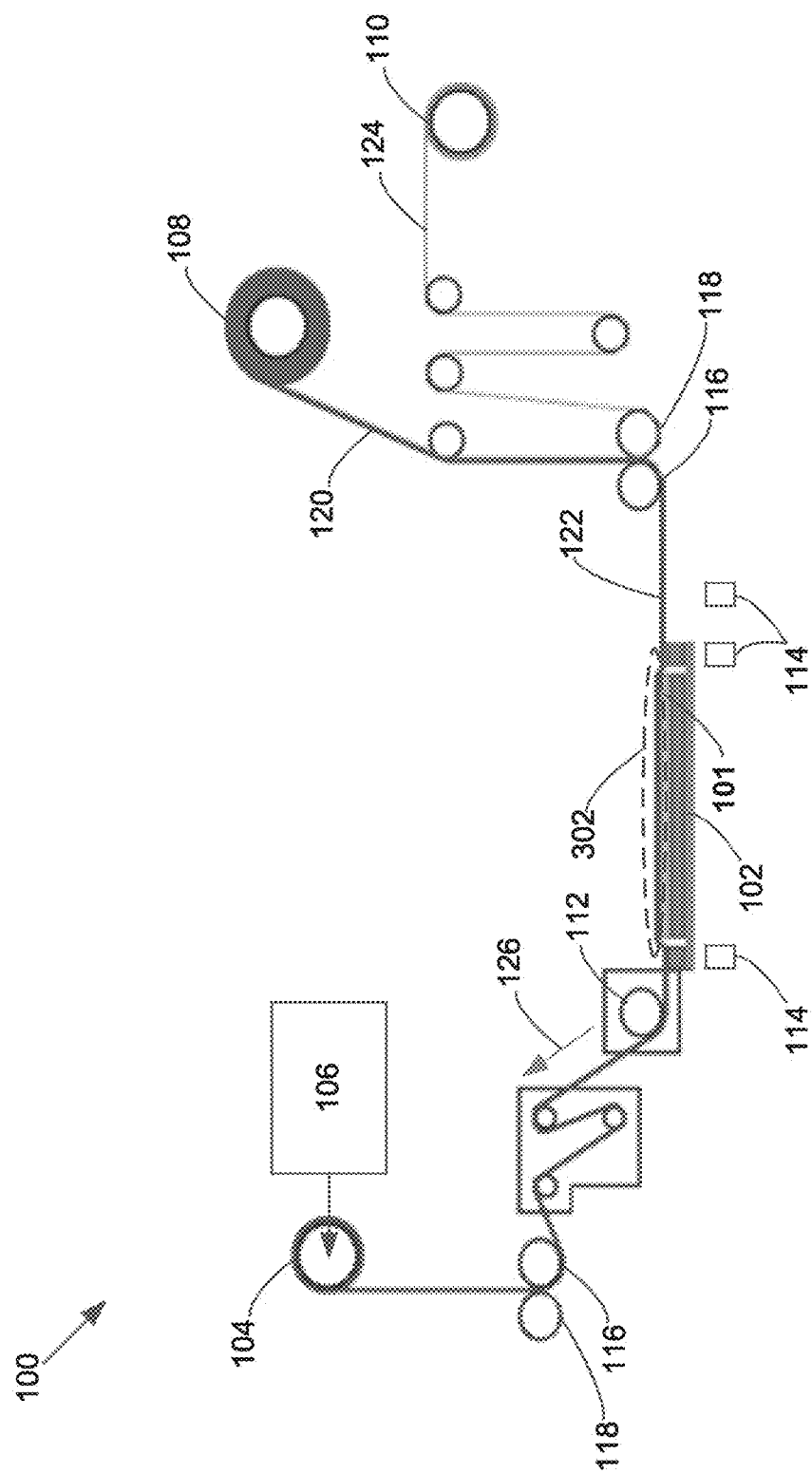
FIG. 3 is a schematic diagram of an exemplary wafer taping apparatus at a finish stage according to some embodiments.

FIG. 3 is a schematic diagram of an exemplary wafer taping apparatus 100 at a finish stage according to some embodiments. The laminator roller 112 in FIG. 3 is shown at the taping finish position at the other side edge of the wafer 101 and taping the laminating tape 122 in the area 302 over the wafer 101 is finished. At the taping finish stage in FIG. 3, the tension controller 106 sets a third tension value of the laminating film 122 using the tension roller 104. An arrow 126 shows the direction of feeding the laminating film 122 from the supply roller 108 to the tension roller 104 (and the tension).

The third tension value is different from the second tension value. In some embodiments, the third tension value at the taping finish stage in FIG. 3 is lower than the second tension value in the taping stage start in FIG. 2 when a dry film is used for the laminating film 122. In one example, 15%-25% tension is applied at the taping finish stage in FIG. 3, compared to 35%-45% tension at the taping start stage in FIG. 2. The percentage tension is referenced based on the maximum variable resistor value (e.g., 50 Kohm) used in the tension controller 106. Actual tension of the lamination tape 122 can vary depending on applications.

In other embodiments, the third tension value at the taping finish stage in FIG. 3 is higher than the second tension value in the taping start stage in FIG. 2 when a back grinding film is used for the laminating tape 122. In one example, 45%-55% tension is applied at the taping finish stage in FIG. 3, compared to 15%-25% tension at the taping start stage in FIG. 2. The tension percentage value is referenced based on the maximum variable resistor value (e.g., 50 Kohm) used in the tension controller 106 in some embodiments. Actual tension of the lamination tape 122 can vary depending on applications.

After the taping finish stage in FIG. 3, the laminator roller 112 is returned to the standby position as shown in FIG. 1. In the examples described above, the same tension values are used for the standby stage in FIG. 1 and the taping finish stage in FIG. 3, but different values can be used in other embodiments.

FIGS. 4A-4B are exemplary wafer tapes 120 used in the wafer taping apparatus 100 in FIGS. 1-3 according to some embodiments. In FIG. 4A, the wafer tape 120 includes a liner 124 such as polyethylene (PE) film, a dry film 404 such as photoresist film, and a carrier film 406 such as polyethylene terephthalate (PET) film. In one example, a PE film (the liner 124) has a thickness of 10 µm-20 µm, a photoresist film (dry film 404) has a thickness of about 120 µm, and the PET film (carrier film 406) has a thickness of 30 µm-40 µm. After the dry film 404 is laminated to the wafer 101, it is followed by a photolithography process such as exposure and pattern developing.

In FIG. 4B, the wafer tape 120 includes a liner 124 such as polyethylene (PE) film and a back grinding film 410. The back grinding film 410 can comprise any suitable material known in the art and may include multiple layers. In one example, a PE film (the liner 124) has a thickness of 10 µm-20 µm and the back grinding film 410 has a thickness of about 400 µm.

By adjusting the tension of the laminating tape 122 for different type film and different wafer structure, better taping (lamination) result can be obtained to reduce defects. For example, this method and apparatus can avoid bubble/wrinkle defect on the laminating tape 122 and/or warping the wafer 101. After the back grinding film 410 is laminated to the wafer 101, it is followed by a backside grinding process.

According to some embodiments, a method includes setting a first tension value of a laminating tape during a standby mode. A second tension value of the laminating tape is set during taping on a wafer. The second tension value is different from the first tension value. A third tension value of the laminating tape is set after taping. The third tension value is different from the second tension value.

According to some embodiments, a wafer lamination apparatus includes a taping table configured hold a wafer during a lamination process. A laminator roller is configured to apply a laminating tape to the wafer. At least one sensor is configured to detect a position of the laminator roller. A tension roller is configured to set a tension of the laminating tape based on the position of the laminator roller.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
  setting a first tension value of a laminating tape during a standby mode;

setting a second tension value of the laminating tape during taping on a wafer, wherein the second tension value is different from the first tension value and greater than zero;

setting a third tension value of the laminating tape after taping, wherein the third tension value is different from the second tension value;

mounting the wafer on a taping table, wherein the taping table is stationary during taping on the wafer;

feeding the laminating tape from a supply roller on a first side of the wafer to a tension roller on a second side of the wafer opposite the first side during the taping on the wafer, wherein the tension roller applies tension in the direction of feeding the laminating tape, downstream of a laminator roller; and applying the laminating tape to the wafer by moving the laminator roller from the first side of the wafer to the second side of the wafer during the taping on the wafer, wherein the first tension value is set when the laminator roller is in a standby position on the first side of the wafer, wherein the second tension value is set when the laminator roller is in a taping start position on the first side of the wafer, and wherein the third tension value is set when the laminator roller reaches a taping finish position on the second side of the wafer, wherein the standby position, taping start position, and taping finish position are in a common plane.

2. The method of claim 1, further comprising detecting a position of the laminator roller.

3. The method of claim 2, wherein the position of the laminator roller is detected using multiple sensors.

4. The method of claim 3, wherein three sensors are located at the standby position, the taping start position, and the taping finish position.

5. The method of claim 1, wherein the laminating tape is a dry film.

6. The method of claim 5, wherein the second tension value is higher than the first tension value and the third tension value is the same as the first tension value.

7. The method of claim 1, wherein the laminating tape is a back grinding film.

8. The method of claim 7, wherein the second tension value is lower than the first tension value and the third tension value is the same as the first tension value.

9. The method of claim 1, wherein the first tension values is 15-25% of a maximum variable resistor value of a tension controller that controls the tension roller, and the second tension value is 35-45% of the maximum variable resistor value of the tension controller.

10. The method of claim 1, wherein the first tension values is 45-55% of a maximum variable resistor value of a tension controller that controls the tension roller, and the second tension value is 15-25% of the maximum variable resistor value of the tension controller.

11. A method, comprising:
mounting a wafer on a taping table;
detecting a position of a laminator roller, wherein the laminator roller is configured to apply a laminating tape to the wafer, wherein the laminating tape is fed from a supply roller on a first side of the wafer to a tension roller on a second side of the wafer opposite the first side, downstream of the laminator roller, and wherein the tension roller applies tension to the laminating tape in the direction of feeding the laminating tape;
setting a first tension value of the laminating tape during a standby mode when the laminator roller is in a standby position on the first side of the wafer;

setting a second tension value of the laminating tape during taping on the wafer when the laminator roller is in a taping start position on the first side of the wafer, wherein the second tension value is different from the first tension value and greater than zero; and setting a third tension value of the laminating tape after taping when the laminator roller reaches a taping finish position on the second side of the wafer, wherein the third tension value is different from the second tension value;

wherein the taping table is stationary in the standby mode, during the taping on the wafer, and after the taping.

12. The method of claim 11, wherein detecting the position of the laminator roller comprises detecting the position with at least one sensor.

13. The method of claim 12, wherein the at least one sensor comprises an obstruction sensor.

14. The method of claim 11, wherein the laminating tape comprises a dry film, and wherein the second tension value is higher than the first tension value and the third tension value is the same as the first tension value.

15. The method of claim 11, wherein the laminating tape comprises a back grinding film, and wherein the second tension value is lower than the first tension value and the third tension value is the same as the first tension value.

16. The method of claim 11, wherein the first tension values is 15-25% of a maximum variable resistor value of a tension controller that controls the tension roller, and the second tension value is 35-45% of the maximum variable resistor value of the tension controller.

17. The method of claim 11, wherein the first tension values is 45-55% of a maximum variable resistor value of a tension controller that controls the tension roller, and the second tension value is 15-25% of the maximum variable resistor value of the tension controller.

18. A method, comprising:
mounting a wafer on a taping table;
feeding a wafer tape from a supply roller on a first side of the wafer, wherein the wafer tape comprises a laminating tape and a liner;
feeding the laminating tape to a tension roller on a second side of the wafer, wherein the tension roller is configured to adjust tension of the laminating tape in the direction of feeding the laminating tape;
detecting a position of a laminator roller, wherein the laminator roller is configured to apply the laminating tape to a wafer, and wherein the laminator roller is positioned between the supply roller and the tension roller;
setting a first tension value of the laminating tape when the laminator roller is at a standby stage on the first side of the wafer;
setting a second tension value of the laminating tape when the laminator roller is at a taping start stage on the first side of the wafer, wherein the second tension value is different from the first tension value and greater than zero; and
setting a third tension value of the laminating tape when the laminator roller reaches a taping finish stage on the second side of the wafer, wherein the third tension value is different from the second tension value;
wherein the taping table is stationary in the standby stage, during the taping on the wafer, and the taping finish stage.

19. The method of claim 18, further comprising separating the liner from the wafer tape, wherein the liner is fed to a recycle roller.

20. The method of claim 19, wherein the liner is fed to the recycle roller using nip rollers.

21. The method of claim 18, wherein the first tension values is 15-25% of a maximum variable resistor value of a tension controller that controls the tension roller, and the second tension value is 35-45% of the maximum variable resistor value of the tension controller.

22. The method of claim 18, wherein the first tension values is 45-55% of a maximum variable resistor value of a tension controller that controls the tension roller, and the second tension value is 15-25% of the maximum variable resistor value of the tension controller.

* * * * *